United States Patent
Tyagi et al.

(10) Patent No.: US 11,728,731 B2
(45) Date of Patent: Aug. 15, 2023

(54) ACCURATE LOAD CURRENT SENSING APPARATUS AND METHOD

(71) Applicant: Intel Corporation, Santa Clara, CA (US)

(72) Inventors: Shobhit Tyagi, UttarPradesh (IN); Saurabh Verma, Bengaluru (IN); Anup Deka, Bangalore (IN)

(73) Assignee: Intel Corporation, Santa Clara, CA (US)

( * ) Notice: Subject to any disclaimer, the term of this patent is extended or adjusted under 35 U.S.C. 154(b) by 217 days.

(21) Appl. No.: 17/110,117

(22) Filed: Dec. 2, 2020

(65) Prior Publication Data

US 2021/0351697 A1    Nov. 11, 2021

(30) Foreign Application Priority Data

May 9, 2020   (IN) .............................. 202041019667

(51) Int. Cl.
| | | |
|---|---|---|
| *H02M 3/158* | (2006.01) | |
| *G06F 1/26* | (2006.01) | |
| *H03K 5/24* | (2006.01) | |
| *H03M 1/66* | (2006.01) | |

(52) U.S. Cl.
CPC .............. *H02M 3/158* (2013.01); *G06F 1/26* (2013.01); *H03K 5/24* (2013.01); *H03M 1/66* (2013.01)

(58) Field of Classification Search
CPC ............ H02M 3/158; G06F 1/26; H03K 5/24; H03M 1/66; G01R 19/0092; G01R 19/16538; G01R 19/2509
See application file for complete search history.

(56) References Cited

U.S. PATENT DOCUMENTS

| | | | | |
|---|---|---|---|---|
| 6,384,636 | B1 * | 5/2002 | Koo ................... | G01R 19/0092 |
| | | | | 327/51 |
| 10,263,518 | B2 * | 4/2019 | Bodano ................ | H02M 1/32 |
| 2010/0079124 | A1 * | 4/2010 | Melanson ............ | H02M 3/158 |
| | | | | 323/283 |
| 2015/0115923 | A1 | 8/2015 | Shao | |
| 2016/0141957 | A1 | 5/2016 | Ozawa | |
| 2017/0063228 | A1 | 3/2017 | Kimura et al. | |
| 2021/0099084 | A1 * | 4/2021 | Cheng ................. | H02M 1/0061 |

OTHER PUBLICATIONS

Office Action dated Dec. 4, 2021 for IN Application No. 202041019667, 6 pages.

* cited by examiner

*Primary Examiner* — Jaweed A Abbaszadeh
*Assistant Examiner* — Brian J Corcoran
(74) *Attorney, Agent, or Firm* — Schwabe, Williamson & Wyatt, P.C.

(57) ABSTRACT

A Ton/2 generator retrofits a digital tracking algorithm to an analog Constant-On-Time (COT) Controller to enable fast sensing. The Ton/2 generation is cognizant of the delay between high-side switch (HSFET) on generation and the actual turn-on time of the HSFET so that there is no deviation of sampling point, and current is reported with high accuracy. The digital tracking algorithm automatically takes higher steps during load transients to enable faster tracking and scales the measured current (Ipeak/2) based on a discontinuous conduction mode (DCM) period for DCM current reporting.

18 Claims, 11 Drawing Sheets

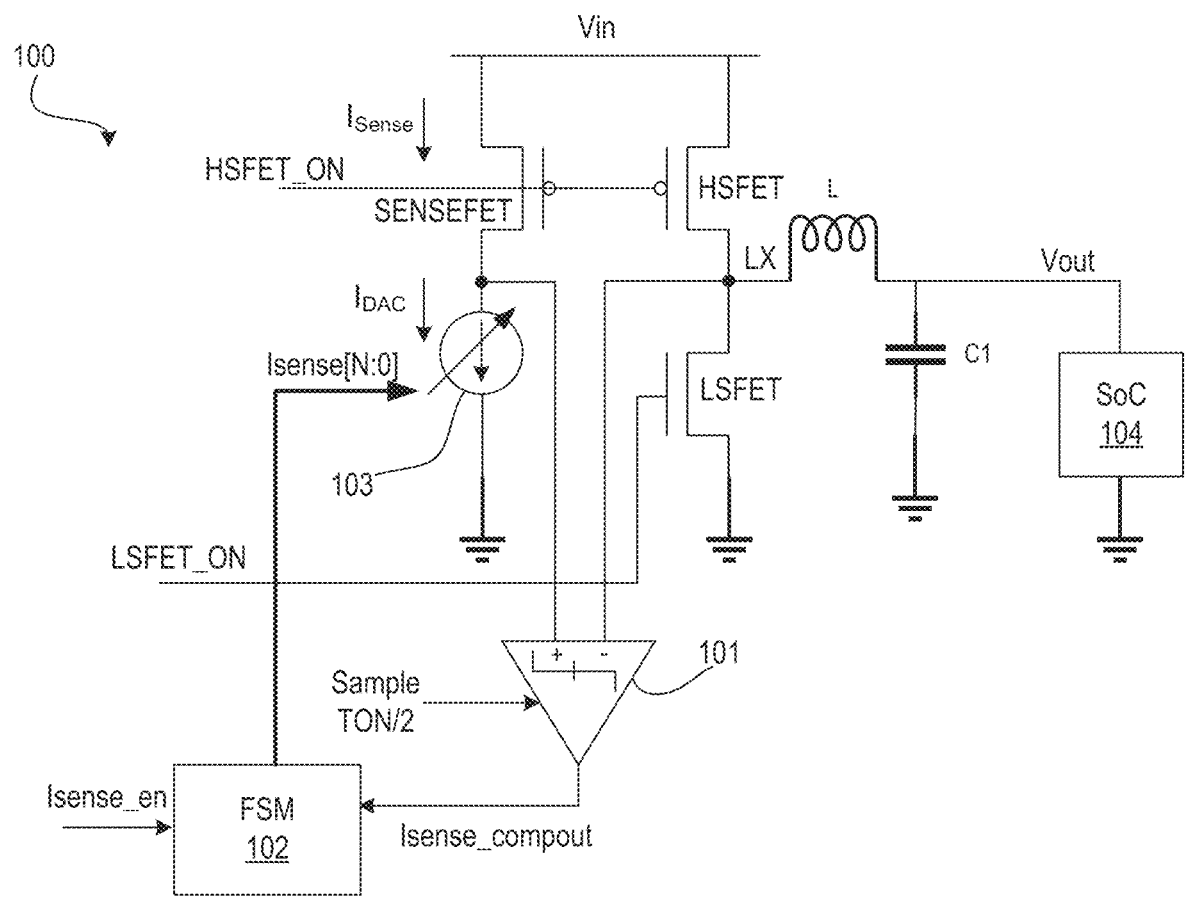
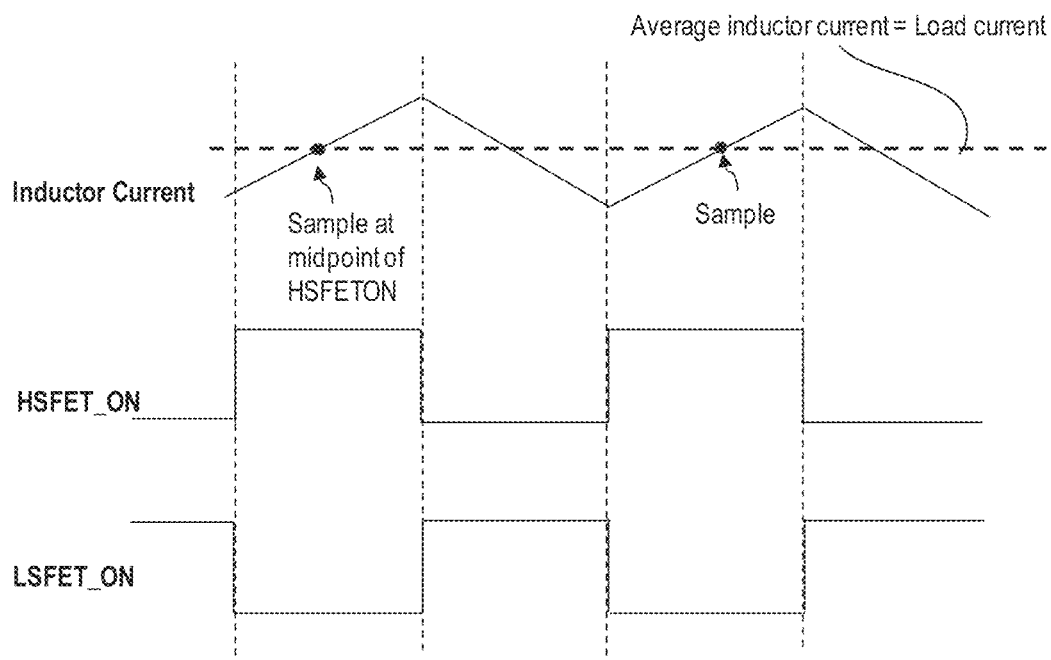
Fig. 1

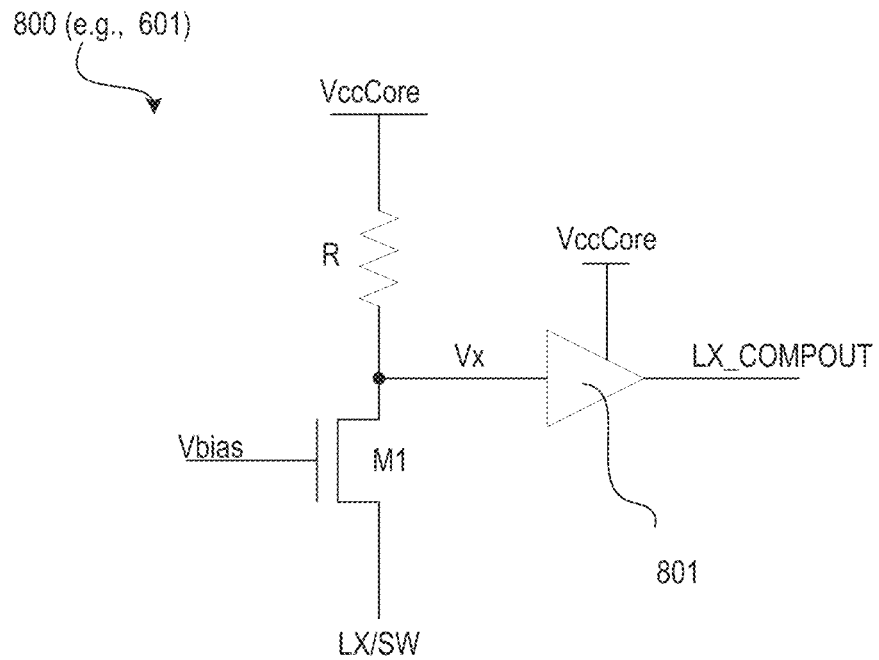
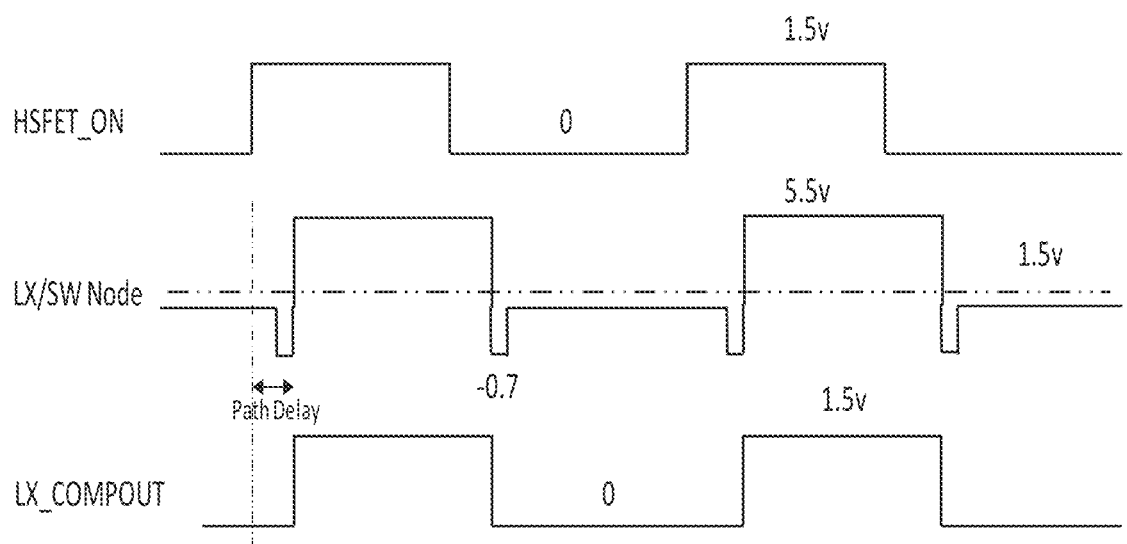
Fig. 8

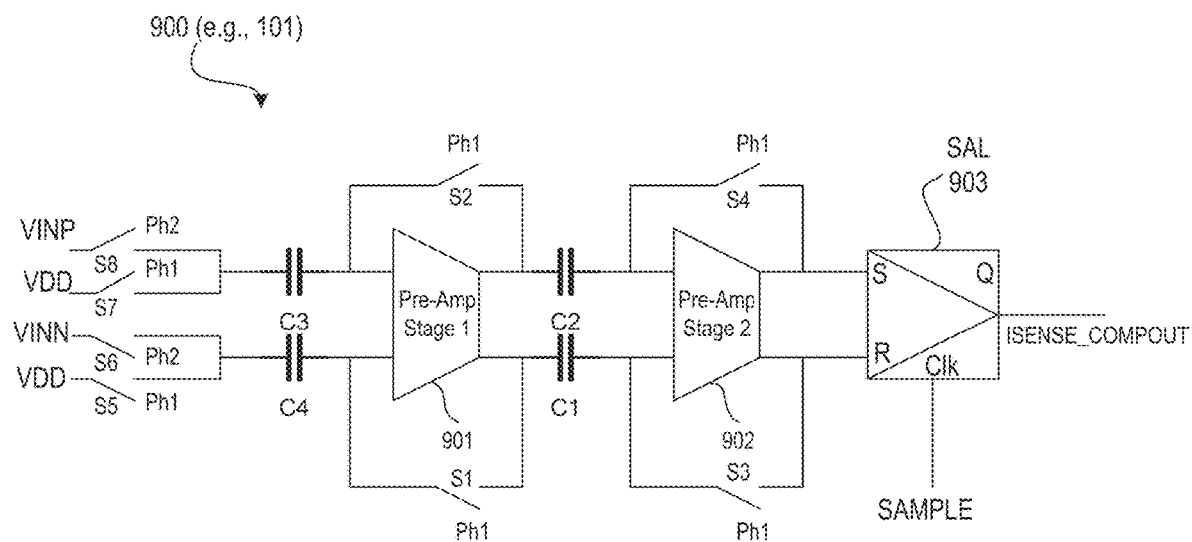
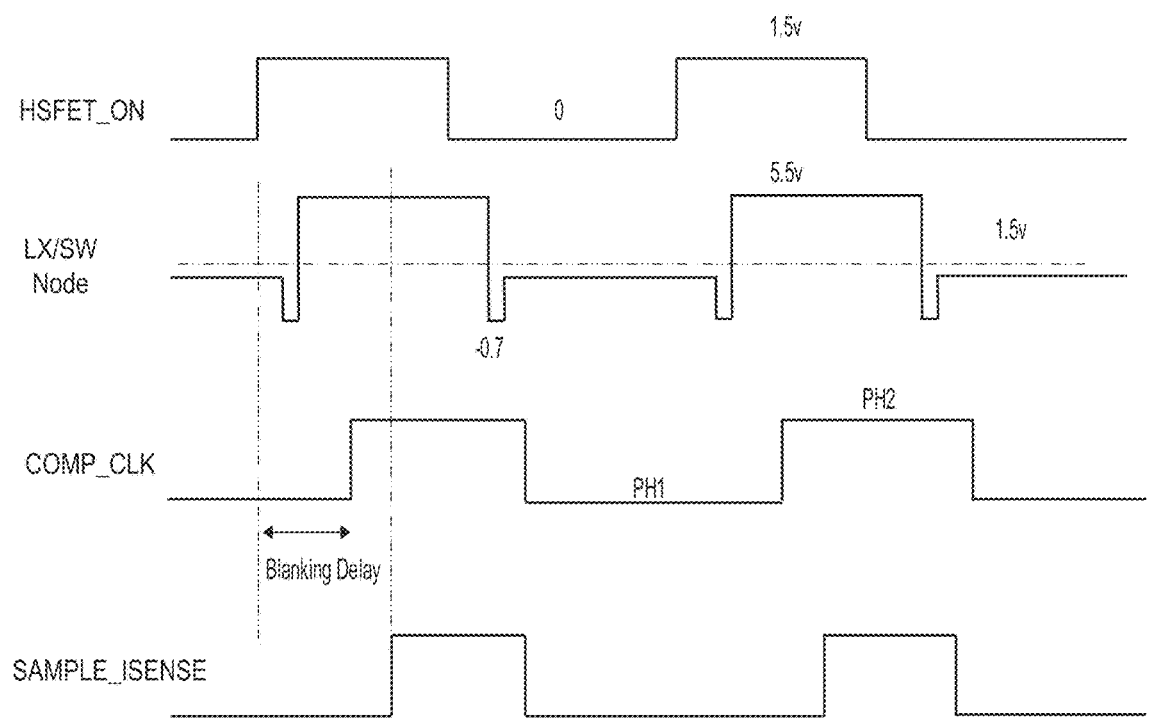
Fig. 9

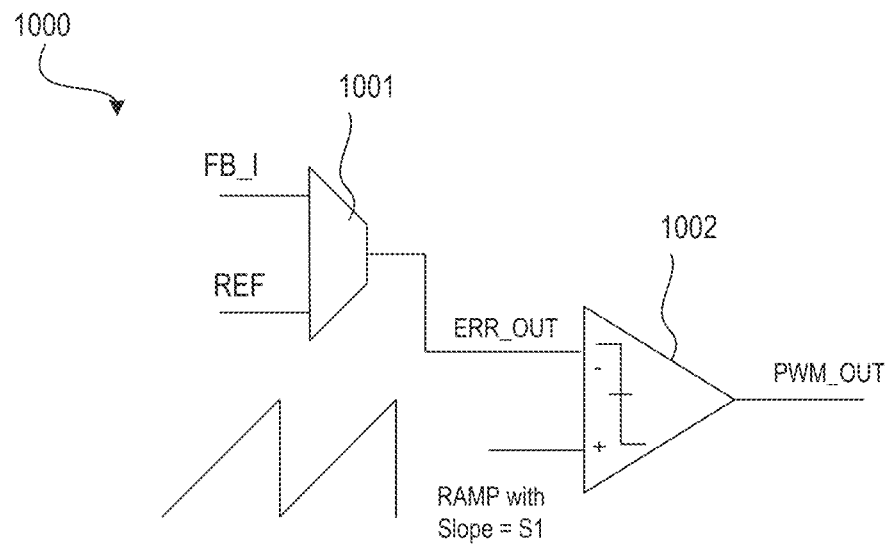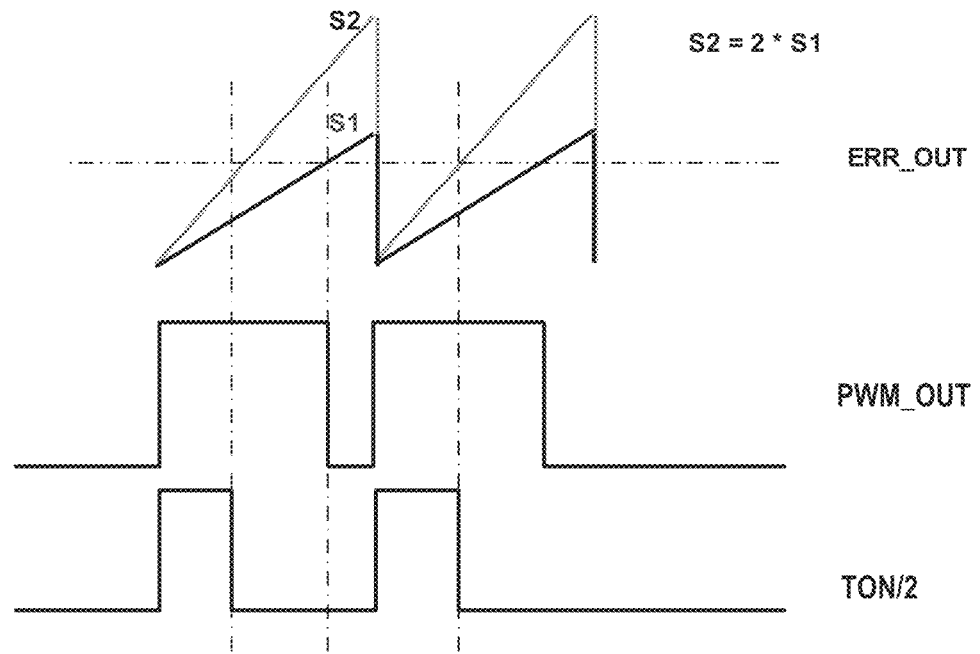
Fig. 10

ACCURATE LOAD CURRENT SENSING APPARATUS AND METHOD

CLAIM FOR PRIORITY

This application claims the benefit of priority of Indian Patent Application No. 202041019667, filed on May 9, 2020, titled "ACCURATE LOAD CURRENT SENSING APPARATUS AND METHOD," and which is incorporated by reference in entirety.

BACKGROUND

Load current sensing provides a customer real-time information about current consumed by different power supply rails in a system-on-chip (SoC). This information is useful for debug and testing to determine whether a software application is consuming higher current than anticipated. Further, an operating system and/or an SoC can use this information in conjunction with temperature data for thermal throttling and fan speed control. Low latency current reporting can be used to detect a Power Virus condition in SoC upon which the SoC can allow exceeding maximum current and/or maximum power (Iccmax/Pmax) for a small duration (e.g., approximately 1 μs) and reduce guard band in normal operation. Accurate and fast current sensing is therefore desired.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 1 illustrates a current tracking apparatus and associated timing diagram, in accordance with some embodiments.

FIG. 8 illustrates a comparator and associated timing diagram for use in FIG. 6, in accordance with some embodiments.

FIG. 9 illustrates a current comparator circuit and associated timing diagram, in accordance with some embodiments.

FIG. 10 illustrates a TON/2 generation circuit for use in analog pulse width modulation (PWM) controller based converters, in accordance with some embodiments.

DETAILED DESCRIPTION

Figure 2:
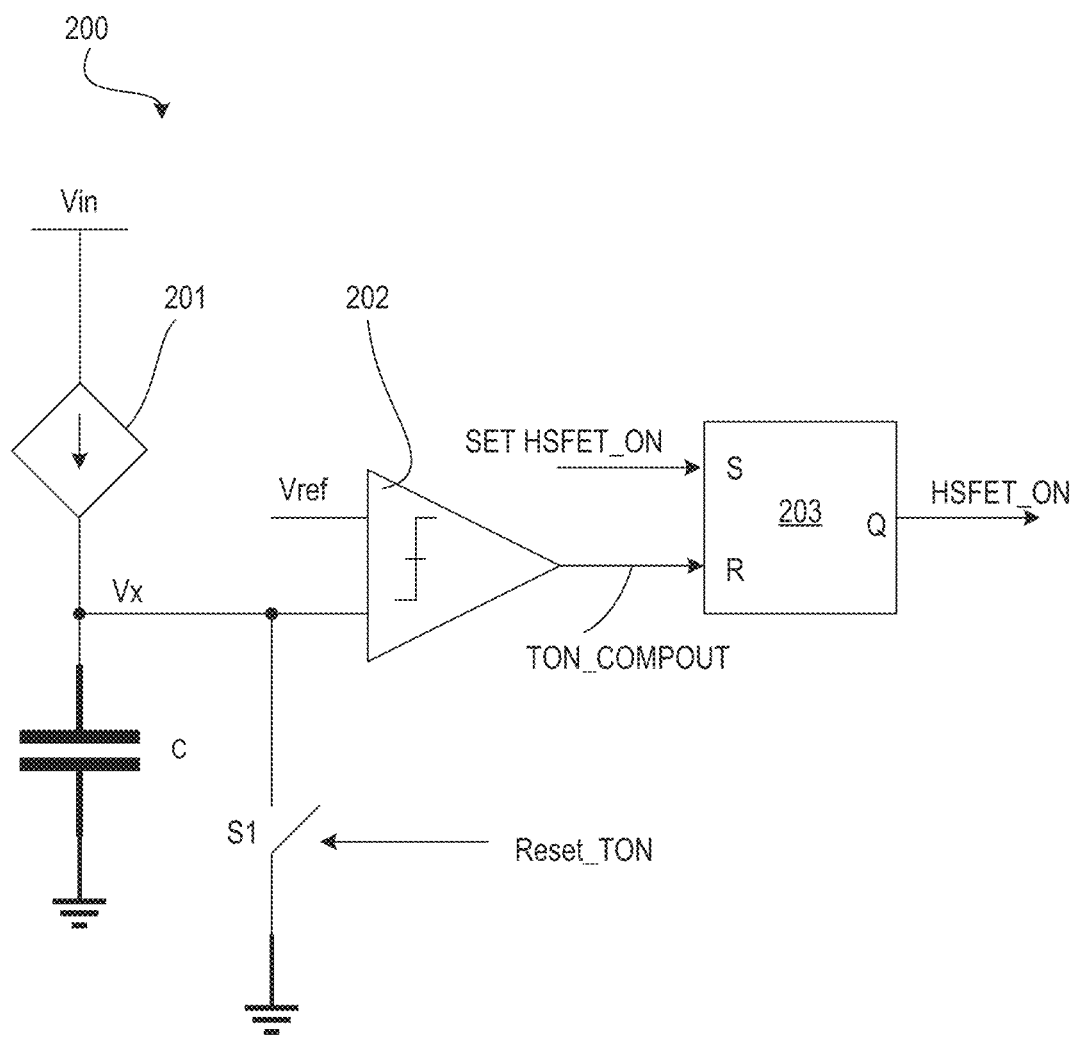
FIG. 2 illustrates an on-time (TON) generation circuit, in accordance with some embodiments.

Existing schemes for sensing load current include analog schemes which rely on averaging inductor current to obtain the load current. For example, a sense resistor is placed in series with the inductor to sense voltage across it, which is used to measure the inductor and load current. In another example, a low pass filter can be used to filter the voltage across the inductor and sense the current through a DC resistance of the inductor. In another example, a current sensing transistor is coupled in parallel with the power transistor (e.g., high-side switch of a regulator) with an amplifier to eliminate the drain-to-source voltage (Vds) mismatch to mirror the power transistor current into a resistor followed by low pass filtering.

For analog schemes that rely on averaging the inductor current, the low pass filter bandwidth (BW) is determined by the minimum Discontinuous Conduction Mode (DCM) current that needs to be sensed as the filter BW is usually about 5 times lower than the minimum DCM frequency. Because of the low bandwidth, the current sensing circuit cannot track the load current fast enough during a load transient. For example, a Constant On Time (CoT) buck converter designed for 2.5 MHz typical switching frequency will have a DCM frequency of 400 kHz when used at an input voltage Vin of 3.3V, an output voltage Vout of 1.2 with 220 nH inductor, and a 47 μF output capacitor. This means that during load transients, the current sensing circuitry will take about $4\tau$ or 10 μs to track the load current.

Existing schemes for sensing load current also include digital schemes. In one such scheme, instead of averaging, the current through a sensing transistor can be sampled at the midpoint of the inductor current ramp to figure out the load current. Digital pulse width modulator (PWM) controllers where the high pulse width is indicated by a digital code (e.g., a multi-bit code) and generated using a PWM modulator (a series of delay lines or frequency counter running at a clock frequency higher than switching frequency) can generate a second signal indicating the midpoint of a High-Side FET (HSFET) on pulse for current sampling. In another example, a digital current tracking algorithm can compare the current through the sensing transistor against a current through a current digital-to-analog converter (IDAC) and increment/decrement the IDAC code in every switching cycle based on the comparison. The tracking algorithm can have options to take higher jumps in the IDAC code for faster conversion during a load transient.

While the digital tracking algorithm circumvents the bandwidth limitation by measuring the current at the midpoint of the inductor current ramp (Ipeak/2) and by having the ability to take multi-step jump during load transients for faster convergence. Such algorithms are typically employed with digital controllers where the midpoint of HSFET ON can be generated easily. The measured Ipeak/2 current, however, needs to be scaled to reflect the load current in DCM. The deviation of the sampling point from the midpoint of HSFET ON results in high inaccuracy for this tracking method. For example, considering maximum Vin (5.5V) and minimum Vout (0.6V) for a buck converter (L=220 nH) powering up system-on-chip, a 5 ns deviation in the sampling point could result in 125 mA inaccuracy in current measurement.

The deviation happens because of the additional latency in HSFET On signal propagating to the switching node. This latency is caused by level shifters, gate driver and HSFET turning on time. As a result, although the sampling point may coincide with the midpoint of the HSFET pulse width at the point of generation, because of the additional latency between HSFET on pulse generation and actual HSFET turning on, the sampling point is earlier than desired. The amount of deviation or latency introduced is a function of voltage and temperature and cannot be trimmed out in High Volume Manufacturing (HVM).

Some embodiments use a Ton/2 generator to retrofit a digital tracking algorithm to an analog Constant-On-Time (COT) Controller to enable fast sensing. Some embodiments employ circuit techniques so that the Ton/2 generation is cognizant of the delay between HSFET ON generation and the actual turn-on time of the HSFET so that there is no deviation of sampling point, and current is reported with high accuracy. The digital tracking algorithm automatically takes higher steps during load transients to enable faster tracking and scales the measured current (Ipeak/2) based on the DCM period for DCM current reporting.

There are many technical effects of various embodiments. For example, accurate load current for different power rails allows for debugging and/or measuring power consumption of a processor in idle and/or active operating modes. The apparatus of various embodiments allows for low latency current reporting to detect virus condition and to allow for higher maximum current (Iccmax) for short durations. As such, guard banding can be reduced in normal operations. As load currents occur in bursts in a modern processor, a low latency current sensing helps a buck converter to enter and/or exit low power mode or for quick phase addition and/or shedding for better average efficiency. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "analog signal" here generally refers to any continuous signal for which the time varying feature (variable) of the signal is a representation of some other time varying quantity, i.e., analogous to another time varying signal.

The term "digital signal" is a physical signal that is a representation of a sequence of discrete values (a quantified discrete-time signal), for example of an arbitrary bit stream, or of a digitized (sampled and analog-to-digital converted) analog signal.

The term "scaling" generally refers to converting a design (schematic and layout) from one process technology to another process technology and may be subsequently being reduced in layout area. In some cases, scaling also refers to upsizing a design from one process technology to another process technology and may be subsequently increasing layout area. The term "scaling" generally also refers to downsizing or upsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−10% of a target value.

Unless otherwise specified, the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions.

It is pointed out that those elements of the figures having the same reference numbers (or names) as the elements of any other figure can operate or function in any manner similar to that described but are not limited to such.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFBT device, on the other hand, has asymmetric Source and Drain terminals. Those skilled in the art will appreciate that other transistors, for example, Bi-polar junction transistors (BJT PNP/NPN), BiCMOS, CMOS, etc., may be used without departing from the scope of the disclosure.

FIG. 1 illustrates current tracking apparatus 100 and associated timing diagram, in accordance with some embodiments. Apparatus 100 comprises a regulator including p-type high-side switch HSFET (high-side field effect transistor), n-type low-side switch LSFET, p-type sense transistor SENSEFET, sampling comparator 101, finite state machine (FSM) 102, and adjustable current digital-to-analog converter ($I_{DAC}$) 103 coupled as shown. HSFET and LSFET of the regulator are coupled to a first terminal inductor L via node LX. A second terminal of inductor L is coupled load capacitor C1 and load (e.g., system-on-chip (SoC) 104, or any suitable load). The input supply to the regulator is Vin while the output supply Vout is the regulated supply. Signal HSFET_ON controls HSFET and SENSEFET while signal LSFET_ON controls the LSFET. FSM 102 generates an adjustable code ISense[N:0] (e.g., a multi-bit code) when ISense_en is asserted. The multi-bit code is used to adjust a current strength through the IDAC. When ISense_en is de-asserted, FSM 102 is disabled and the current sensing circuitry is thus disabled.

In some embodiments, SENSEFET is used to mirror the HSFET current. As such, SENSFET and HSFET are controlled by a same signal, HSFET_ON. In some embodiments, SENSFET is the same size as HSFET. In some embodiments, SENSEFET has a lower ratio than HSFET (e.g., the ratio of the size is lower). If the SENSEFET current ($I_{Sense}$) is sampled at the midpoint of the inductor current ramp in Continuous Conduction Mode (CCM), it would correspond to the load current. Here, load current is indicated by the N-bit code, Isense[N:0]. In some embodiments, the SENSEFET current $I_{Sense}$ is compared against $I_{DA}c$ current at a sampling point. Here, $I_{DA}c$ current is the current through the current DAC 103.

DAC 103 is an apparatus that converts digital data (e.g., binary or thermometer coded ISense[N:0]) into current analog signal. In some embodiments, the DAC is a switched binary weighted current source. In other embodiments, other type of DACs such as thermometer coded switched current sources DAC, segmented current sources DAC, etc. may be used for implementing DAC 103. Any suitable current DAC may be used for implementing DAC 103. Any suitable DAC may be used for implementing DAC 103.

Based on $I_{DAC}$ current being higher or lower than SENSEFET current $I_{Sense}$, as indicated by the comparator output Isense_compout being '1' or '0', FSM 102 increments or decrements the $I_{DA}c$ current in every switching cycle such that it tracks the load current. At steady state load, when FSM 102 converges, the $I_{DA}c$ code ISense[N:0] dithers between two codes, where 'N' is a number. These two codes may be separated by one or two least significant bits (LSBs). For example, the two codes are two neighboring codes. $I_{DAC}$ code ISense[N:0] can be a binary code, thermometer code, or any other suitable code. If load current (e.g., current through inductor L) is to be tracked, then the sampling point for comparator 101 should coincide with the exact midpoint of inductor ramp or the HSFET On Phase, which is TON/2 as indicated by the timing diagram. In some embodiments, comparator 101 comprises a single-stage amplifier. In some embodiments, comparator 101 comprises a multi-stage amplifier.

Figure 3:
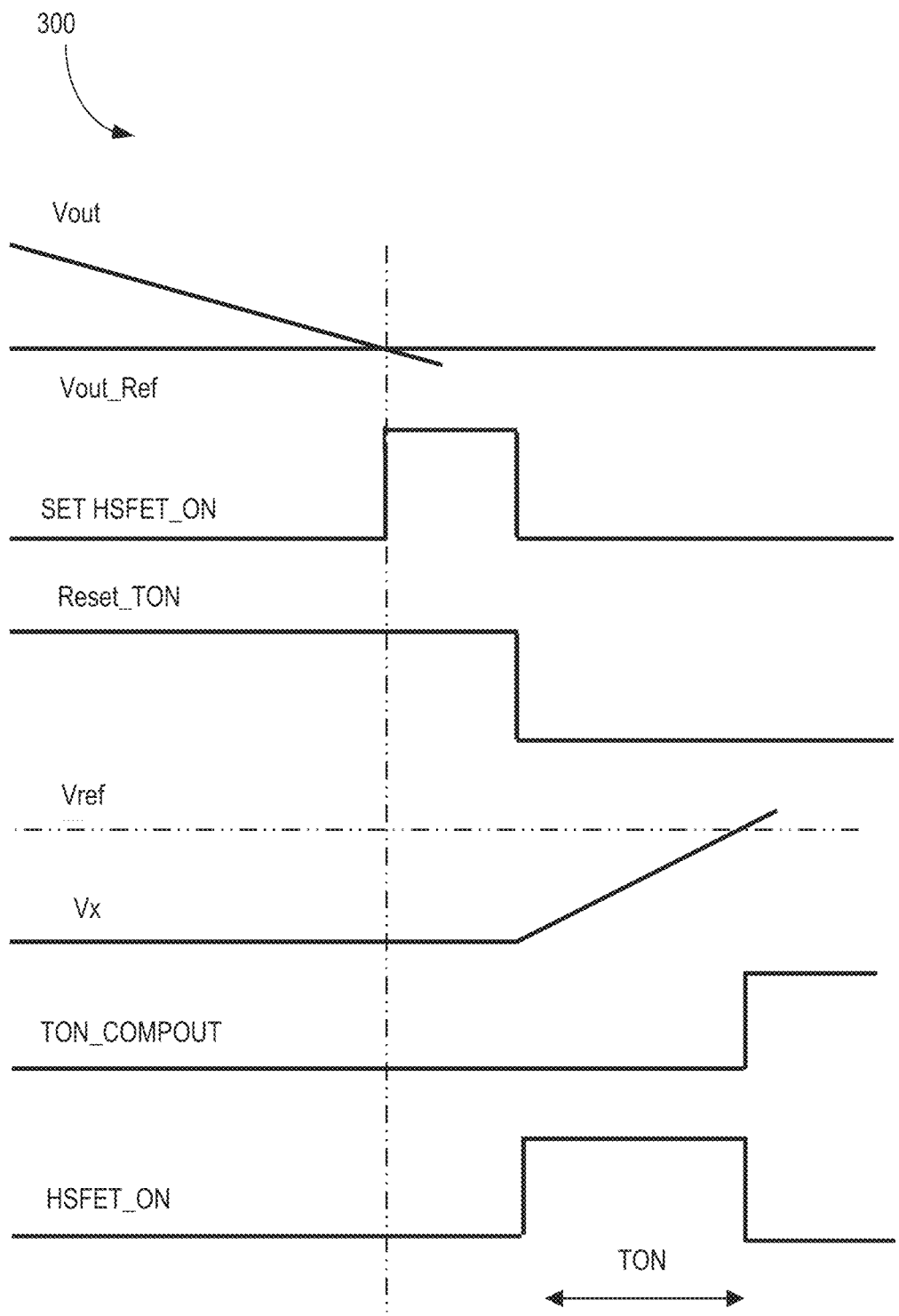
FIG. 3 illustrates a timing diagram of the TON generation circuit to maintain a constant high-side switch (HSFET) ON pulse width, in accordance with some embodiments.

FIG. 2 illustrates an on-time (TON) generation circuit 200, in accordance with some embodiments. FIG. 3 illustrates timing diagram 300 of the TON generation circuit to maintain a constant high-side switch (HSFET) ON pulse width, in accordance with some embodiments.

Circuit 200 comprises current source 201, capacitor C, switch S1, voltage comparator 202, and latch 203 coupled as shown. Comparator 202 compares Vx with a reference voltage Vref. In some embodiments, comparator 202 comprises a single-stage amplifier. In some embodiments, comparator 202 comprises a multi-stage amplifier. Here, node names and signal names are interchangeably used. For example, Vx may refer to node Vx or voltage Vx depending on the context of the sentence. Any suitable reference generator can be used to generate Vref. For example, a voltage divider or resistor divider can generate Vref. In some embodiments, Vref is adjustable or programmable (e.g., via hardware (e.g., fuse, registers) or software (e.g., firmware, operating system, etc.)). The output of comparator 202 is TON_COMPOUT. TON_COMPOUT indicates whether the voltage on Vx is higher or lower than Vref. TON_COMPOUT is coupled to a reset input 'R' of a set-reset latch (SR latch) 203. In some embodiments, a flip-flop or any other suitable sequential unit or logic may be used instead of an SR latch to perform the same function as that of the SR latch. The set input 'S' receives SET HSFET_ON signal from a logic that determines the start of the ON time of the HSFET. For example, a feedback loop that compares Vout with another reference VOUT_REF, determines when to assert SET HSFET_ON signal. For instance, when Vout cross VOUT_REF, SET HSFET_ON is asserted. The output of latch 203 is the HSFET_ON signal that turns on HSFET and SENSEFET of FIG. 1.

Referring back to FIG. 2, a constant on-time (CoT) controller employs a TON generator to generate the HSFET_ON pulse (an ON pulse) to charge the output capacitor C whenever the output Vout falls below the target Vout_Ref. At steady state, with the ON time being fixed, the controller modulates the OFF time or switching period to regulate the output Vout. Since HSFET conduction time, TON, remains fixed, sampling point TON/2 is derived to extract the load current information, in accordance with some embodiments. TON is expressed as:

$$TON = \frac{c \cdot V_{ref}}{I} \quad (1)$$

In Adaptive On-Time controllers, the ON time TON is modulated based on Vin and Vout to maintain pseudo-constant frequency but the TON/2 will also be modulated accordingly too. Accuracy of measurement of load current depends on how close the sampling point is to the midpoint of the conduction phase of HSFET. When the output Vx is below the reference Vref, the control loop turns on the HSFET and the reset switch S1 on Vx node is turned off via Reset_TON signal. The voltage on Vx ramps linearly from 0 V due to the constant current I being pumped into the capacitor C. When the linearly ramping Vx crosses reference Vref after a time duration of TON, comparator 202 output TON_COMPOUT trips signaling the end of HSFET_ON.

Figure 4:
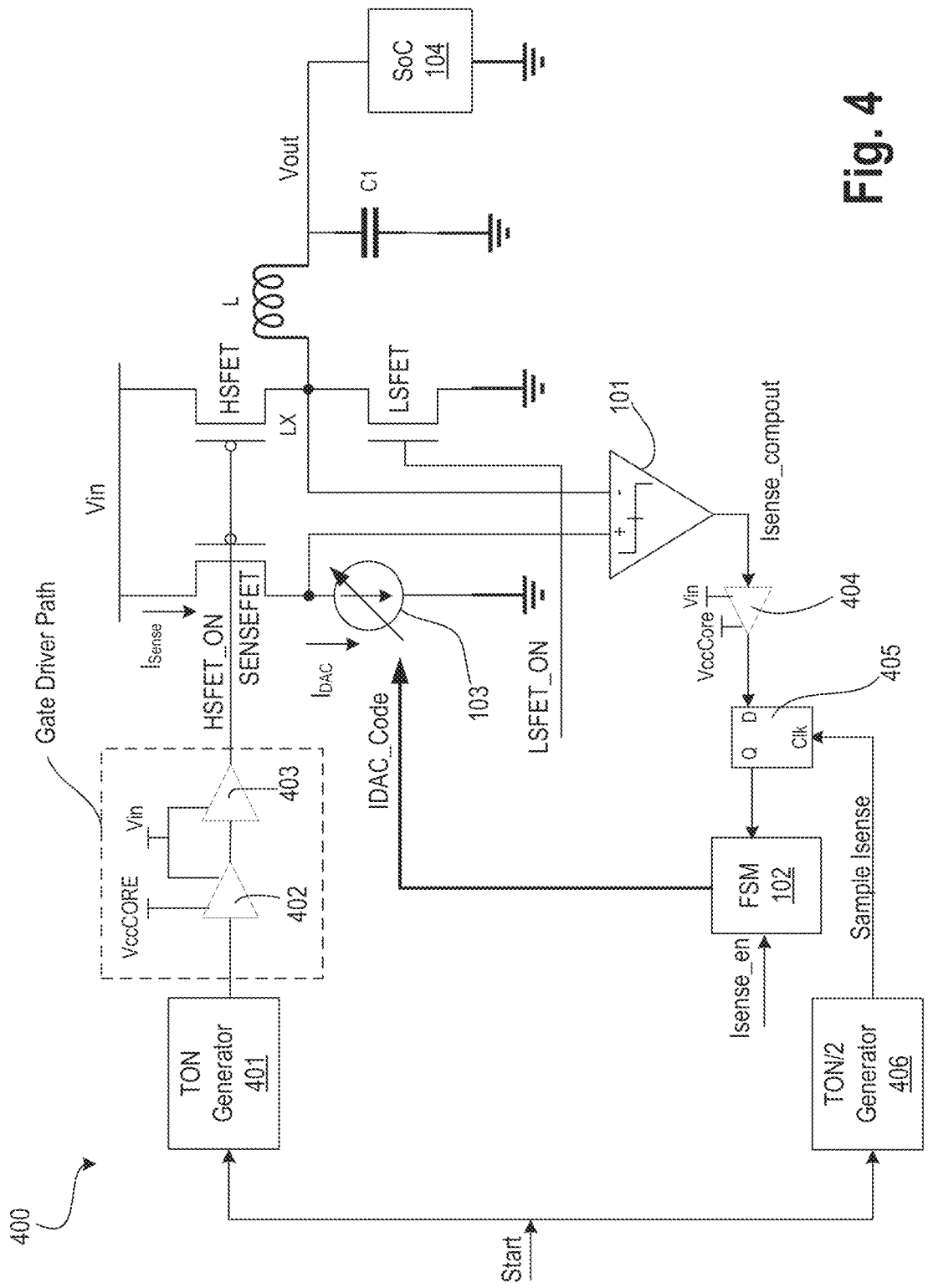
FIG. 4 illustrates a current tracking apparatus for a constant-on-time (COT) buck converter with TON and TON/2 generation circuits, in accordance with some embodiments.

FIG. 4 illustrates a current tracking apparatus 400 for a constant-on-time (COT) buck converter with TON and TON/2 generation circuits, in accordance with some embodiments. In addition to the features discussed with reference to FIG. 1, apparatus 400 comprises TON Generator 401 (e.g., TON generator 200), level-shifters 402 and 404, buffer or driver 403, sequential logic or unit 405 (e.g., flip-flop, latch, etc.), and TON/2 Generator 406 coupled as shown. In some embodiments, TON/2 Generation circuit 406 is a replica of TON circuit 401 (e.g., 200) with either capacitance C reduced to half, C/2, or with charging current I doubled to 2I from source 201. The linear ramp of the voltage on Vx node is therefore twice as fast for the TON/2 circuit 406 resulting in the TON/2 comparator tripping at half the time as the TON comparator 202. Level-shifter 402 level-shifts the output of TON generator 401 from VccCore domain to Vin power domain. Level-shifter 404 level-shifts the output of comparator 101 from Vin power domain to VccCore power domain.

The TON and TON/2 generation circuits 401 and 406, respectively, generate the HSFET On pulse and a second pulse (Sample ISense) indicating the sampling point where the inductor current needs to be compared against the $I_{DA}c$ current for tracking the load. Both TON and TON/2 generation circuits 401 and 406 begin to generate the TON or TON/2 pulse upon a Start signal. FSM 102 updates the IDAC_code (same as ISense[N:0]) in every switching cycle and upon convergence, the IDAC_code provides digital information about the load current. The novelty of generating a TON/2 allows us to retrofit a digital current tracking algorithm used conventionally with digital controllers into an analog controller based buck converter.

Figure 5:
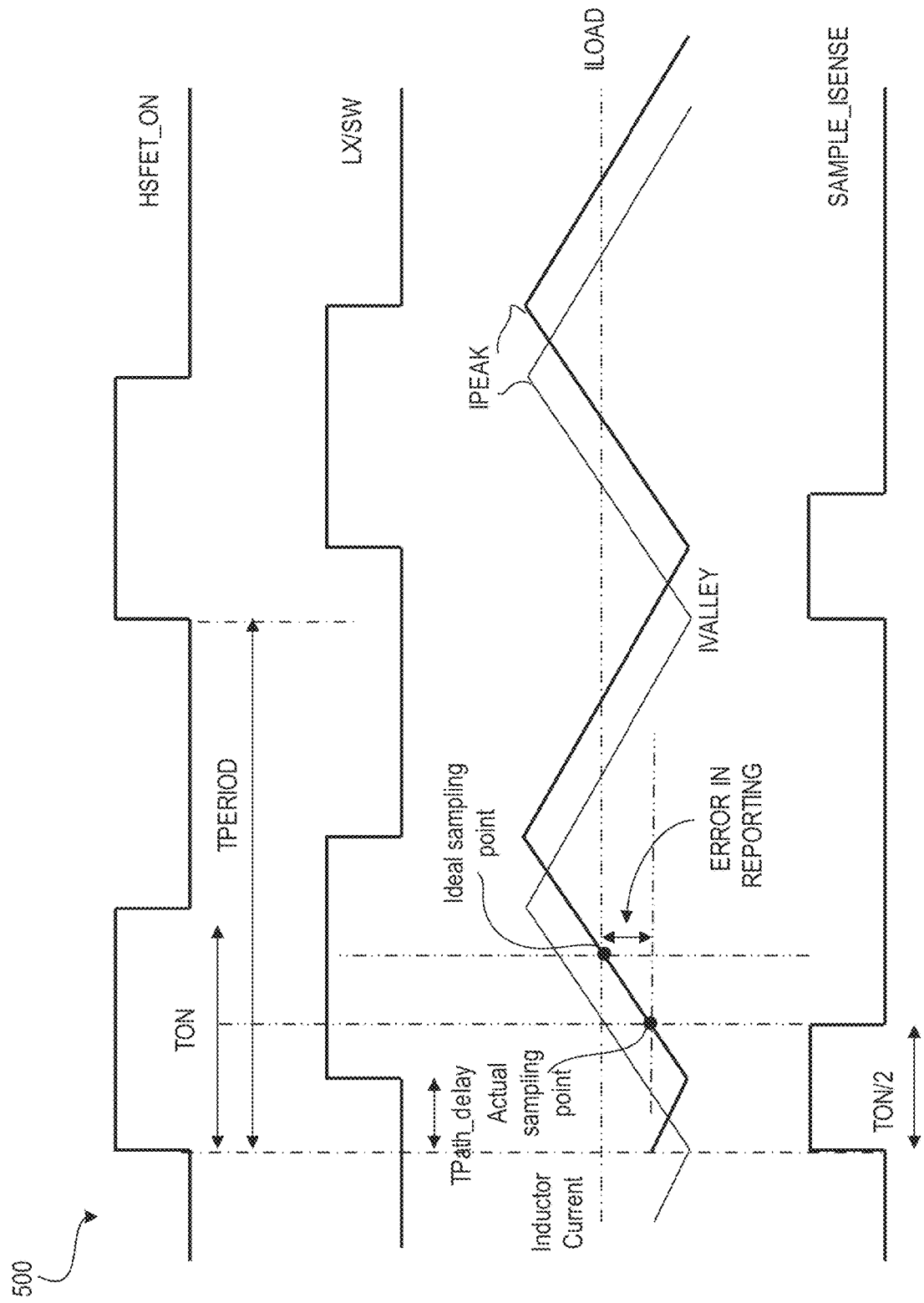
FIG. 5 illustrates a timing diagram showing possible error in current reporting due to driver path delay.

FIG. 5 illustrates timing diagram 500 showing possible error in current reporting due to driver path delay. The scheme that employs sensing the inductor current at TON/2 may exhibit an issue that once the TON is generated, the pulse from generator 401 must propagate through level-shifter 402 from controller supply to Vin rail, gate predrivers and driver 403 along with the additional turn-on time latency of the HSFET. The TON/2 path (comprising generator 406 and sampler 405) used to sample the inductor current, does not encompass these delays (e.g., the gate driver path delay), resulting in an earlier sampling point as shown in timing diagram 500. This results in current sensing inaccuracy.

Figure 6:
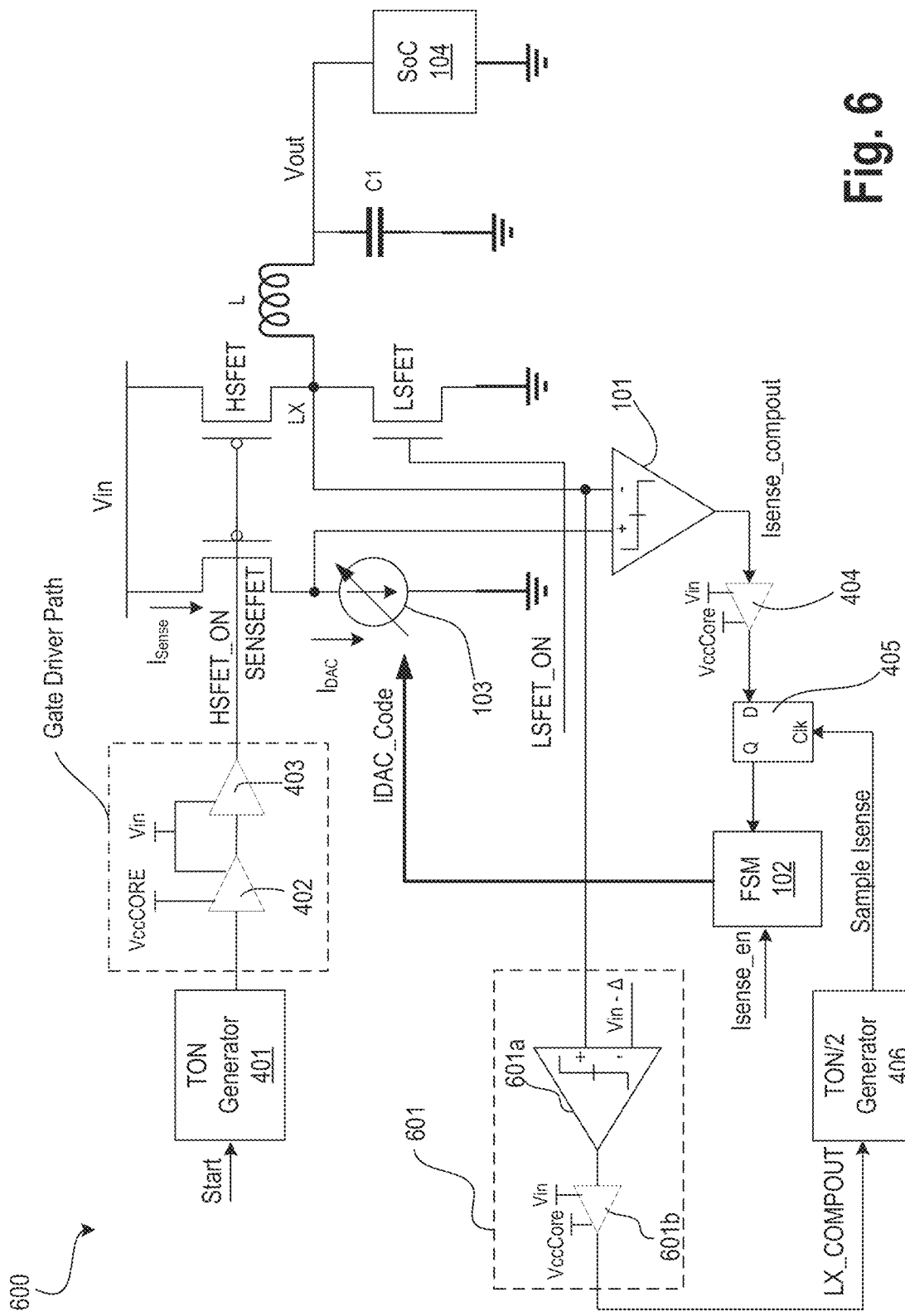
FIG. 6 illustrates a current tracking apparatus, for a COT buck converter with TON and TON/2 generation circuits, which is agnostic to driver path delay, in accordance with some embodiments.

FIG. 6 illustrates current tracking apparatus 600, for a COT buck converter with TON and TON/2 generation circuits, which is agnostic to driver path delay, in accordance with some embodiments. Apparatus 600 is similar to FIG. 4 but for an additional compensation block 601 which determines when to start or initiate TON/2 Generator 406. Compared to apparatus 400, here the starting mechanism for TON Generators 401 and 406 are decoupled. Compensation block 601 comprises comparator 601a and level-shifter 601b coupled as shown. The output of comparator 601a is used to determine when to sample the output of compactor 101 and therefor when to control the IDAC. The delay of the HSFET On path (comprising TON generator 401 and level-shifter 402 and driver 403) is compensated by using comparator 601a on the LX node to detect actual turn on of the HSFET and indicate when the capacitor of TON/2 generator 406 reset is de-asserted and when TON/2 generation should start. The modified scheme mitigates sampling point deviation in apparatus 400 due to latency on HSFET gate driver path.

Digital tracking FSM 102 continuously updates an IDAC_Code based on current comparison between SENSEFET current and $I_{DAC}$ current at TON/2 sampling point in each switching cycle. When the $I_{DAC}$ FSM 102 converges, the IDAC_Code dithers between two neighboring codes and the comparator output toggles low and high in alternate cycles. If the ISense_compout of comparator 101 remains at static 0 or 1 for a few cycles without toggling, it indicates a load transient event and FSM 102 intelligently causes IDAC_Code to take higher jumps for faster tracking. The step size for the IDAC_Code can be increased to 'M' for faster tracking when no change is observed for 'N' cycles where 'M' and 'N' can be both programmed through registers.

Figure 7:
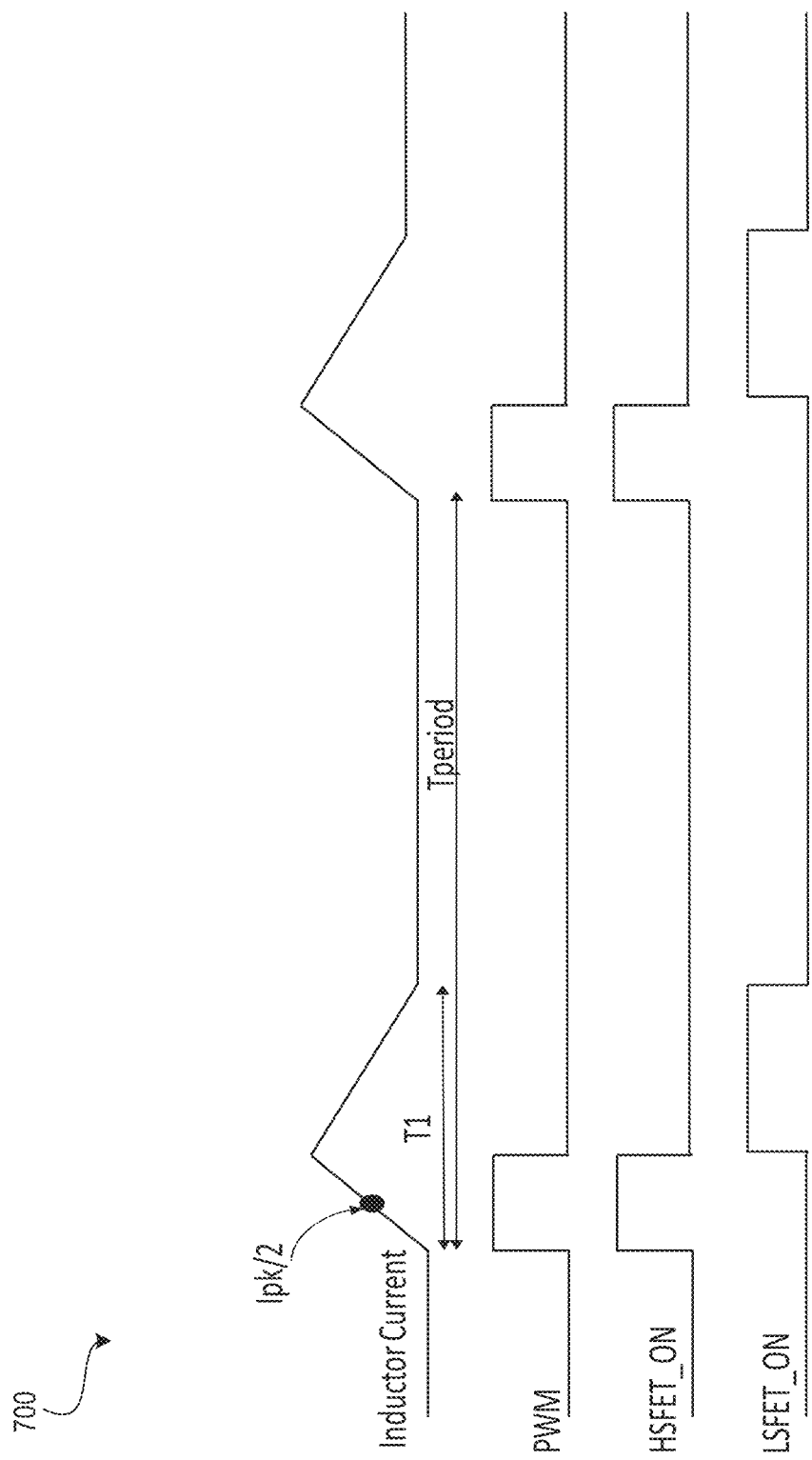
FIG. 7 illustrates a timing diagram for load current in Discontinuous Conduction Mode (DCM).

FIG. 7 illustrates timing diagram 700 for load current in Discontinuous Conduction Mode (DCM). A DCM event is marked by inductor current going to zero, thus causing a ZCD (zero crossing detection) trip. This information is used by the FSM to switch between DCM and Continuous Conduction Mode (CCM) current calculations. As shown in the FIG. 7, in DCM, TON/2 sampling gives Peak current information ($I_{pk}/2$) instead of the load current and the current reported by IDAC needs to be scaled to get the actual load current.

Load current in DCM can be calculated using the relation:

$$I_{LOAD} = \frac{\frac{I_{pk}}{2} * T1}{Tperiod} \qquad (2)$$

$T_{PERIOD}$ is calculated by counting the number of edges of a high frequency 12 MHz clock in one switching window. This averaging is done over multiple cycles of PWM clock (programmable through register) for higher accuracy. T1 remains fixed in an adaptive on time controller and is programmed through registers (in terms of number of cycles of the same high frequency, e.g., 12 MHz clock) but can be counted separately with a high frequency clock in a different embodiment.

FIG. 8 illustrates comparator or compensation circuitry 800 (e.g., 601) and associated timing diagram for use in FIG. 6, in accordance with some embodiments. In some embodiments, comparator circuitry 800 comprises an n-type transistor M1, resistor R (or a resistive device), and buffer 801 coupled as shown. The resistor R can be implemented as a transistor in linear more or a discrete transistor offered by a process technology node. The source/drain terminal of transistor M1 is coupled to node LX (which is the first terminal of the inductor L). The gate of the transistor M1 is coupled to bias voltage Vbias. Vbias biases the n-type transistor M1. The supply rail is VccCore coupled to the resistor buffer 801. In some embodiments, transistor M1 is a high-voltage transistor compared to logic transistors in SoC 104 which are low-voltage transistors. Comparator circuitry 800 is essentially a current comparator circuit, in accordance with some embodiments. When the HSFET is turned ON and LX node is pulled to Vin (e.g., 2.2 V-5.5 V), the n-type transistor M1 turns off and Vx node is pulled up. LX_COMPOUT toggles 'High' indicating the HSFET turns on. When the LSFET is ON, LX remains at substantially 0 V, M1 turns on and if designed to have an on-resistance of, for example, R/10 or lower, it pulls down Vx below the threshold of the buffer and LX_COMPOUT remains low'.

Since the LX node in a switching regulator experiences a high amount of ringing, and voltage levels that are higher than supply or lower than ground during dead time, the LX comparator 800 is designed as common gate configuration with fixed gate bias (e.g., 1.5v) for device reliability.

FIG. 9 illustrates current comparator circuit 900 (e.g., comparator 101) and associated timing diagram, in accordance with some embodiments. Comparator circuit 900 comprises one or more pre-amplifier stages 901 and 902, capacitors C1, C2, C3, and C4, strong arm latch (SAL) 903, and switches S1, S2, S3, S4, S5, S6, S7, and S8 coupled as shown. In some embodiments, pre-amplifier stages 901 and/or 902 are single-stage amplifiers. In some embodiments, pre-amplifier stages 901 and/or 902 are multi-stage amplifiers. For a two-phase clock COMP_CLK, Phase 1 (Ph1) and Phase 2 (Ph2) are used for controlling the various switches. Ph1 is used to control S1, S2, S3, S4, S5, and S7, while Ph1 is used to control phases S6 and S8. When Ph1 is high, Ph2 is low. The output of SAL 903 is ISENSE_COMPOUT.

During the reset phase Ph1, when the HSFET is off, switches S5 and S7 close so that the two input terminals of the capacitors C3 and C4 are both tied to VDD. During this phase Ph1, the preamplifier stage 901 is configured in unity gain feedback mode by closing switches S1 and S2 thereby storing the information of the inherent offset of the pre-amplifier as charges on the capacitors C3 and C4. Likewise, the switches S3, S4 also close in Ph1 and the preamplifier second stage 902 is also configured in unity gain feedback mode, thus storing its inherent offset information on capacitors C1 and C2.

During the evaluation phase Ph2, when the HSI-ET is on, switches S5, S7 open and switches S6, S8 close so that two input terminals of the capacitors C3 and C4 now connect to the two VINP and VINN nodes that are to be compared. The differential voltage between VINP and VINN couples to the input of the pre-amplifier 901 through capacitors C3 and C4 which, in turn, amplifies and couples the differential amplified voltage to the input of pre-amplifier 902 through capacitors C1 and C2.

The strong arm latch (SAL) 903 regenerates this differential amplified voltage to rail-to-rail full swing output and latches the value at the rising edge of the SAMPLE node. In this example, VINN connects to the LX node and VINP connects to the SENSEFET drain as shown in FIG. 4. Comparing the differential voltage between the two nodes determines if the $I_{DAC}$ current is higher or lower than the actual load current it indicates. For example, if the HSFET and SENSEFT ratio is 1:1 and the HSI-ET current is higher than the DAC current, the voltage drop across HSFET will be higher than that across the SENSEFET. Thus, the LX voltage will be lower than the SENSEFET drain and the comparator output will be HIGH thereby indicating FSM 102 to increase the $I_{DAC}$ current to converge on the correct IDAC_Code.

In addition to sampling edge inaccuracy, other factors contributing to overall accuracy of current sensor are comparator offset and delay. For operating condition of Vin=5 V, Vout=1 V, Iload=1 A, L=250 nH, 1 ns delay results in 1.6% Error or 1 mV offset may result in 7% Error. In this example, the resistance of the HSFET is about 15 mOhm. Another requirement for the comparator is that it needs to operate at input voltage levels close to supply.

Current comparator circuit 900 is a 2-stage switch capacitor comparator with Auto-Offset cancellation followed by a strong-arm latch 903. In ph1 (LSFET is On) both inputs are tied to supply while Pre-Amp Stage 1 901 and Stage 2 902 are configured into unity gain feedback mode, thus storing offsets into capacitors for offset cancellation. In Ph2 (HSFET is on), unity gain feedback is removed, the actual inputs are applied for amplification followed by sampling by signal SAMPLE and regeneration using SAL 903. In this example, the overall delay is less than 1 ns.

FIG. 10 illustrates TON/2 generation circuit 1000 for use in analog pulse width modulation (PWM) controller based converters, in accordance with some embodiments. In PWM controller based converters, duty cycle of a PWM wave is modulated to control the switching characteristics of the HSFET and the LSFET. The current sensing scheme of various embodiments can be further extended to conventional analog PWM controllers that uses an internal ramp for generating a pulse based on an error voltage. The error voltage indicates a difference between the output voltage Vout (or a derivative of it FB_I) and a reference voltage REF. So as not to obscure the embodiments, merely a portion of the DC-DC converter that generates the PWM wave is shown. The portion comprises error amplifier 1001 and voltage comparator 1002. Error amplifier generates ERR_OUT (and error signal) indicating a difference between a reference voltage REF and a feedback voltage which is Vout or a version of Vout. Voltage comparator 1002 compares ERR_OUT with a first ramp having slope S1. As the ramp signal periodically toggles, a PWM_OUT signal is generated as a pulse train with duty cycle as a function of ERR_OUT. PWM_OUT determines the ON and OFF times of the HSFET. A second ramp with twice the height of the first ramp for PWM generation is used to generate a midpoint of HSI-ET On in a conventional analog controller. Here, the second ramp has a slope of S2.

In context of FIG. 6, modified for PWM based controllers, TON/2 Generator 406 is modified. The modified TON/2 comprises the TON/2 generator 100 where ramp signal with slope S1 is replaced with the second ramp with slope S1. The output of the modified TON/2 generator is PWM_OUT which replaces Sample ISense of FIG. 6. This Sample_ISense samples the center (or substantially the center) of the HSFET ON time. The associated IDAC_Code represents the inductor current at the center (or substantially the center) or middle) of the HSFET ON time.

Figure 11:
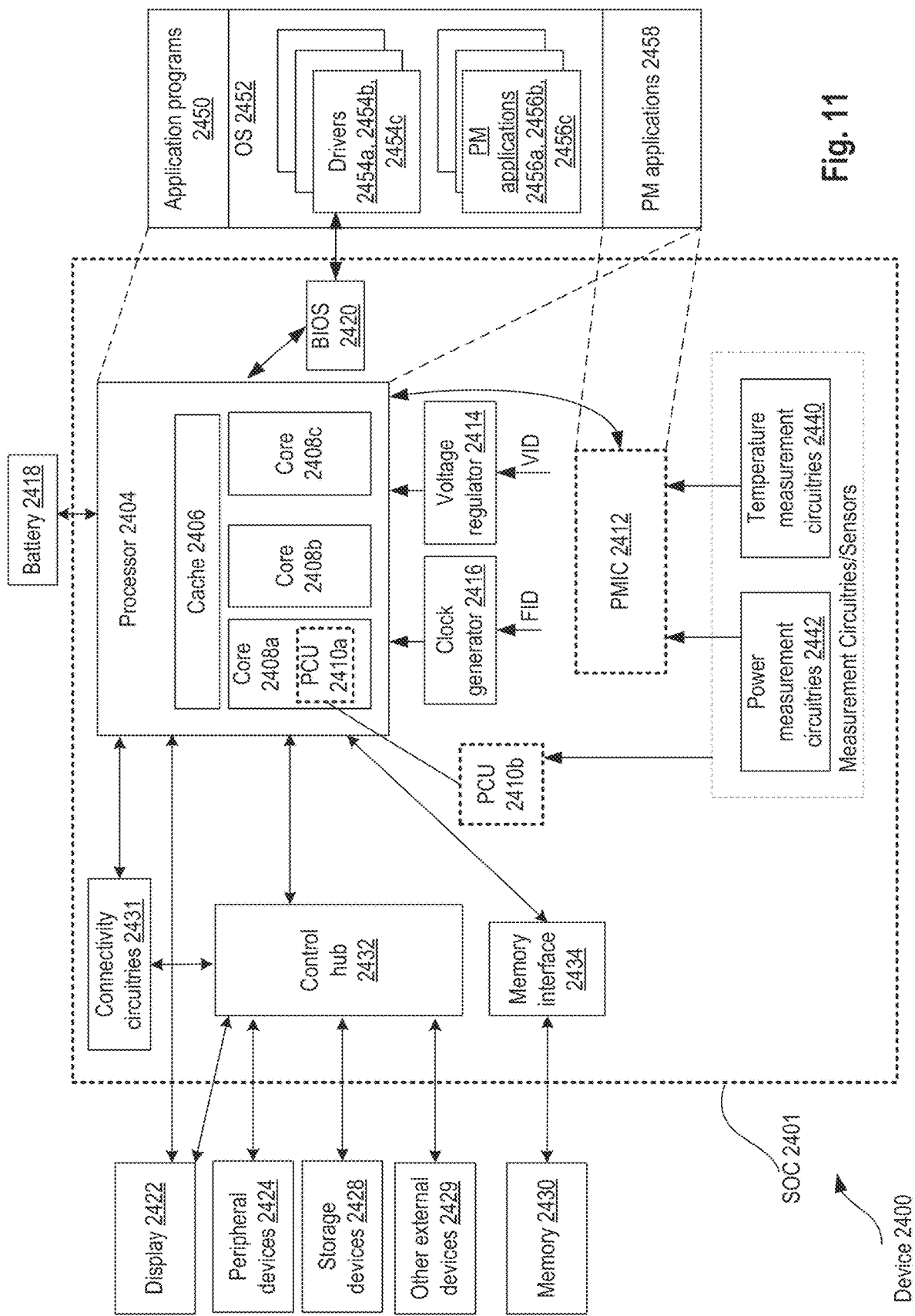
FIG. 11 illustrates a smart device or a computer system or an SoC (System-on-Chip) having current tracking apparatus, in accordance with various embodiments.

FIG. 11 illustrates a smart device or a computer system or a SoC (System-on-Chip) having current tracking apparatus, in accordance with various embodiments. It is pointed out that those elements of FIG. 11 having the same reference numbers (or names) as the elements of any other figure can operate or function in any manner similar to that described, but are not limited to such. Any of the blocks described here can have the current tracking apparatus. For example, the LDOs, VRs, and over DC-DC converters can use the scheme described here in to measure the current from different power rails.

In some embodiments, device 2400 represents an appropriate computing device, such as a computing tablet, a mobile phone or smart-phone, a laptop, a desktop, an Internet-of-Things (IOT) device, a server, a wearable device, a set-top box, a wireless-enabled e-reader, or the like. It will be understood that certain components are shown generally, and not all components of such a device are shown in device 2400.

In an example, the device 2400 comprises a SoC (System-on-Chip) 2401. An example boundary of the SOC 2401 is illustrated using dotted lines in FIG. 11, with some example components being illustrated to be included within SOC 2401—however, SOC 2401 may include any appropriate components of device 2400.

In some embodiments, device 2400 includes processor 2404. Processor 2404 can include one or more physical devices, such as microprocessors, application processors, microcontrollers, programmable logic devices, processing cores, or other processing means. The processing operations performed by processor 2404 include the execution of an operating platform or operating system on which applications and/or device functions are executed. The processing operations include operations related to I/O (input/output) with a human user or with other devices, operations related to power management, operations related to connecting computing device 2400 to another device, and/or the like. The processing operations may also include operations related to audio I/O and/or display I/O.

In some embodiments, processor 2404 includes multiple processing cores (also referred to as cores) 2408a, 2408b, 2408c. Although merely three cores 2408a, 2408b, 2408c are illustrated in FIG. 11, processor 2404 may include any other appropriate number of processing cores, e.g., tens, or even hundreds of processing cores. Processor cores 2408a, 2408b, 2408c may be implemented on a single integrated circuit (IC) chip. Moreover, the chip may include one or more shared and/or private caches, buses or interconnections, graphics and/or memory controllers, or other components.

In some embodiments, processor 2404 includes cache 2406. In an example, sections of cache 2406 may be dedicated to individual cores 2408 (e.g., a first section of cache 2406 dedicated to core 2408a, a second section of cache 2406 dedicated to core 2408b, and so on). In an example, one or more sections of cache 2406 may be shared among two or more of cores 2408. Cache 2406 may be split in different levels, e.g., level 1 (L1) cache, level 2 (L2) cache, level 3 (L3) cache, etc.

In some embodiments, processor core 2404 may include a fetch unit to fetch instructions (including instructions with conditional branches) for execution by the core 2404. The instructions may be fetched from any storage devices such as the memory 2430. Processor core 2404 may also include a decode unit to decode the fetched instruction. For example, the decode unit may decode the fetched instruction into a plurality of micro-operations. Processor core 2404 may include a schedule unit to perform various operations associated with storing decoded instructions. For example, the schedule unit may hold data from the decode unit until the instructions are ready for dispatch, e.g., until all source values of a decoded instruction become available. In one embodiment, the schedule unit may schedule and/or issue (or dispatch) decoded instructions to an execution unit for execution.

The execution unit may execute the dispatched instructions after they are decoded (e.g., by the decode unit) and dispatched (e.g., by the schedule unit). In an embodiment, the execution unit may include more than one execution unit (such as an imaging computational unit, a graphics computational unit, a general-purpose computational unit, etc.). The execution unit may also perform various arithmetic operations such as addition, subtraction, multiplication, and/or division, and may include one or more an arithmetic logic units (ALUs). In an embodiment, a co-processor (not shown) may perform various arithmetic operations in conjunction with the execution unit.

Further, execution unit may execute instructions out-of-order. Hence, processor core 2404 may be an out-of-order processor core in one embodiment. Processor core 2404 may also include a retirement unit. The retirement unit may retire executed instructions after they are committed. In an embodiment, retirement of the executed instructions may result in processor state being committed from the execution of the instructions, physical registers used by the instructions being de-allocated, etc. Processor core 2404 may also include a bus unit to enable communication between components of processor core 2404 and other components via one or more buses. Processor core 2404 may also include one or more registers to store data accessed by various components of the core 2404 (such as values related to assigned app priorities and/or sub-system states (modes) association.

In some embodiments, device 2400 comprises connectivity circuitries 2431. For example, connectivity circuitries 2431 includes hardware devices (e.g., wireless and/or wired connectors and communication hardware) and/or software components (e.g., drivers, protocol stacks), e.g., to enable device 2400 to communicate with external devices. Device 2400 may be separate from the external devices, such as other computing devices, wireless access points or base stations, etc.

In an example, connectivity circuitries 2431 may include multiple different types of connectivity. To generalize, the connectivity circuitries 2431 may include cellular connectivity circuitries, wireless connectivity circuitries, etc. Cellular connectivity circuitries of connectivity circuitries 2431 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. Wireless connectivity circuitries (or wireless interface) of the connectivity circuitries 2431 refers to wireless connectivity that is not cellular, and can include personal area networks (such as Bluetooth, Near Field, etc.), local area networks (such as Wi-Fi), and/or wide area networks (such as WiMax), and/or other wireless communication. In an example, connectivity circuitries 2431 may include a network interface, such as a wired or wireless interface, e.g., so that a system embodiment may be incorporated into a wireless device, for example, a cell phone or personal digital assistant.

In some embodiments, device 2400 comprises control hub 2432, which represents hardware devices and/or software components related to interaction with one or more I/O devices. For example, processor 2404 may communicate with one or more of display 2422, one or more peripheral devices 2424, storage devices 2428, one or more other external devices 2429, etc., via control hub 2432. Control hub 2432 may be a chipset, a Platform Control Hub (PCH), and/or the like.

For example, control hub 2432 illustrates one or more connection points for additional devices that connect to device 2400, e.g., through which a user might interact with the system. For example, devices (e.g., devices 2429) that can be attached to device 2400 include microphone devices, speaker or stereo systems, audio devices, video systems or other display devices, keyboard or keypad devices, or other I/O devices for use with specific applications such as card readers or other devices.

As mentioned above, control hub 2432 can interact with audio devices, display 2422, etc. For example, input through a microphone or other audio device can provide input or commands for one or more applications or functions of device 2400. Additionally, audio output can be provided instead of, or in addition to display output. In another example, if display 2422 includes a touch screen, display 2422 also acts as an input device, which can be at least partially managed by control hub 2432. There can also be additional buttons or switches on computing device 2400 to provide I/O functions managed by control hub 2432. In one embodiment, control hub 2432 manages devices such as accelerometers, cameras, light sensors or other environmental sensors, or other hardware that can be included in device 2400. The input can be part of direct user interaction, as well as providing environmental input to the system to influence its operations (such as filtering for noise, adjusting displays for brightness detection, applying a flash for a camera, or other features).

In some embodiments, control hub 2432 may couple to various devices using any appropriate communication protocol, e.g., PCIe (Peripheral Component Interconnect Express), USB (Universal Serial Bus), Thunderbolt, High Definition Multimedia Interface (HDMI), Firewire, etc.

In some embodiments, display 2422 represents hardware (e.g., display devices) and software (e.g., drivers) components that provide a visual and/or tactile display for a user to interact with device 2400. Display 2422 may include a display interface, a display screen, and/or hardware device used to provide a display to a user. In some embodiments, display 2422 includes a touch screen (or touch pad) device that provides both output and input to a user. In an example, display 2422 may communicate directly with the processor 2404. Display 2422 can be one or more of an internal display device, as in a mobile electronic device or a laptop device or an external display device attached via a display interface (e.g., DisplayPort, etc.). In one embodiment display 2422 can be a head mounted display (HMD) such as a stereoscopic display device for use in virtual reality (VR) applications or augmented reality (AR) applications.

In some embodiments, and although not illustrated in the figure, in addition to (or instead of) processor 2404, device 2400 may include Graphics Processing Unit (GPU) comprising one or more graphics processing cores, which may control one or more aspects of displaying contents on display 2422.

Control hub 2432 (or platform controller hub) may include hardware interfaces and connectors, as well as software components (e.g., drivers, protocol stacks) to make peripheral connections, e.g., to peripheral devices 2424.

It will be understood that device 2400 could both be a peripheral device to other computing devices, as well as have peripheral devices connected to it. Device 2400 may have a "docking" connector to connect to other computing devices for purposes such as managing (e.g., downloading and/or uploading, changing, synchronizing) content on device 2400. Additionally, a docking connector can allow device 2400 to connect to certain peripherals that allow computing device 2400 to control content output, for example, to audiovisual or other systems.

In addition to a proprietary docking connector or other proprietary connection hardware, device 2400 can make peripheral connections via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, connectivity circuitries 2431 may be coupled to control hub 2432, e.g., in addition to, or instead of, being coupled directly to the processor 2404. In some embodiments, display 2422 may be coupled to control hub 2432, e.g., in addition to, or instead of, being coupled directly to processor 2404.

In some embodiments, device 2400 comprises memory 2430 coupled to processor 2404 via memory interface 2434. Memory 2430 includes memory devices for storing information in device 2400.

In some embodiments, memory 2430 includes apparatus to maintain stable clocking as described with reference to various embodiments. Memory can include nonvolatile (state does not change if power to the memory device is interrupted) and/or volatile (state is indeterminate if power to the memory device is interrupted) memory devices. Memory device 2430 can be a dynamic random access memory (DRAM) device, a static random access memory (SRAM) device, flash memory device, phase-change memory device, or some other memory device having suitable performance to serve as process memory. In one embodiment, memory 2430 can operate as system memory for device 2400, to store data and instructions for use when the one or more processors 2404 executes an application or process. Memory 2430 can store application data, user data, music, photos, documents, or other data, as well as system data (whether long-term or temporary) related to the execution of the applications and functions of device 2400.

Elements of various embodiments and examples are also provided as a machine-readable medium (e.g., memory 2430) for storing the computer-executable instructions (e.g., instructions to implement any other processes discussed herein). The machine-readable medium (e.g., memory 2430) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, device 2400 comprises temperature measurement circuitries 2440, e.g., for measuring temperature of various components of device 2400. In an example, temperature measurement circuitries 2440 may be embedded, or coupled or attached to various components, whose temperature are to be measured and monitored. For example, temperature measurement circuitries 2440 may measure temperature of (or within) one or more of cores 2408a, 2408b, 2408c, voltage regulator 2414, memory 2430, a mother-board of SOC 2401, and/or any appropriate component of device 2400.

In some embodiments, device 2400 comprises power measurement circuitries 2442, e.g., for measuring power consumed by one or more components of the device 2400. In an example, in addition to, or instead of, measuring power, the power measurement circuitries 2442 may measure voltage and/or current. In an example, the power measurement circuitries 2442 may be embedded, or coupled or attached to various components, whose power, voltage, and/or current consumption are to be measured and monitored. For example, power measurement circuitries 2442 may measure power, current and/or voltage supplied by one or more voltage regulators 2414, power supplied to SOC 2401, power supplied to device 2400, power consumed by processor 2404 (or any other component) of device 2400, etc.

In some embodiments, device 2400 comprises one or more voltage regulator circuitries, generally referred to as voltage regulator (VR) 2414. VR 2414 generates signals at appropriate voltage levels, which may be supplied to operate any appropriate components of the device 2400. Merely as an example, VR 2414 is illustrated to be supplying signals to processor 2404 of device 2400. In some embodiments, VR 2414 receives one or more Voltage Identification (VID) signals, and generates the voltage signal at an appropriate level, based on the VID signals. Various type of VRs may be utilized for the VR 2414. For example, VR 2414 may include a "buck" VR, "boost" VR, a combination of buck and boost VRs, low dropout (LDO) regulators, switching DC-DC regulators, constant-on-time controller based DC-DC regulator, etc. Buck VR is generally used in power delivery applications in which an input voltage needs to be transformed to an output voltage in a ratio that is smaller than unity. Boost VR is generally used in power delivery applications in which an input voltage needs to be transformed to an output voltage in a ratio that is larger than unity. In some embodiments, each processor core has its own VR, which is controlled by PCU 2410*a/b* and/or PMIC 2412. In some embodiments, each core has a network of distributed LDOs to provide efficient control for power management. The LDOs can be digital, analog, or a combination of digital or analog LDOs. In some embodiments, VR 2414 includes current tracking apparatus to measure current through power supply rail(s).

In some embodiments, device 2400 comprises one or more clock generator circuitries, generally referred to as clock generator 2416. Clock generator 2416 generates clock signals at appropriate frequency levels, which may be supplied to any appropriate components of device 2400. Merely as an example, clock generator 2416 is illustrated to be supplying clock signals to processor 2404 of device 2400. In some embodiments, clock generator 2416 receives one or more Frequency Identification (FID) signals, and generates the clock signals at an appropriate frequency, based on the FID signals.

In some embodiments, device 2400 comprises battery 2418 supplying power to various components of device 2400. Merely as an example, battery 2418 is illustrated to be supplying power to processor 2404. Although not illustrated in the figures, device 2400 may comprise a charging circuitry, e.g., to recharge the battery, based on Alternating Current (AC) power supply received from an AC adapter.

In some embodiments, device 2400 comprises Power Control Unit (PCU) 2410 (also referred to as Power Management Unit (PMU), Power Controller, etc.). In an example, some sections of PCU 2410 may be implemented by one or more processing cores 2408, and these sections of PCU 2410 are symbolically illustrated using a dotted box and labelled PCU 2410*a*. In an example, some other sections of PCU 2410 may be implemented outside the processing cores 2408, and these sections of PCU 2410 are symbolically illustrated using a dotted box and labelled as PCU 2410*b*. PCU 2410 may implement various power management operations for device 2400. PCU 2410 may include hardware interfaces, hardware circuitries, connectors, registers, etc., as well as software components (e.g., drivers, protocol stacks), to implement various power management operations for device 2400.

In some embodiments, device 2400 comprises Power Management Integrated Circuit (PMIC) 2412, e.g., to implement various power management operations for device 2400. In some embodiments, PMIC 2412 is a Reconfigurable Power Management ICs (RPMICs) and/or an IMVP (Intel® Mobile Voltage Positioning). In an example, the PMIC is within an IC chip separate from processor 2404. The may implement various power management operations for device 2400. PMIC 2412 may include hardware interfaces, hardware circuitries, connectors, registers, etc., as well as software components (e.g., drivers, protocol stacks), to implement various power management operations for device 2400.

In an example, device 2400 comprises one or both PCU 2410 or PMIC 2412. In an example, any one of PCU 2410 or PMIC 2412 may be absent in device 2400, and hence, these components are illustrated using dotted lines.

Various power management operations of device 2400 may be performed by PCU 2410, by PMIC 2412, or by a combination of PCU 2410 and PMIC 2412. For example, PCU 2410 and/or PMIC 2412 may select a power state (e.g., P-state) for various components of device 2400. For example, PCU 2410 and/or PMIC 2412 may select a power state (e.g., in accordance with the ACPI (Advanced Configuration and Power Interface) specification) for various components of device 2400. Merely as an example, PCU 2410 and/or PMIC 2412 may cause various components of the device 2400 to transition to a sleep state, to an active state, to an appropriate C state (e.g., C0 state, or another appropriate C state, in accordance with the ACPI specification), etc. In an example, PCU 2410 and/or PMIC 2412 may control a voltage output by VR 2414 and/or a frequency of a clock signal output by the clock generator, e.g., by outputting the VID signal and/or the FID signal, respectively. In an example, PCU 2410 and/or PMIC 2412 may control battery power usage, charging of battery 2418, and features related to power saving operation.

The clock generator 2416 can comprise a phase locked loop (PLL), frequency locked loop (FLL), or any suitable clock source. In some embodiments, each core of processor 2404 has its own clock source. As such, each core can operate at a frequency independent of the frequency of operation of the other core. In some embodiments, PCU 2410 and/or PMIC 2412 performs adaptive or dynamic frequency scaling or adjustment. For example, clock frequency of a processor core can be increased if the core is not operating at its maximum power consumption threshold or limit. In some embodiments, PCU 2410 and/or PMIC 2412 determines the operating condition of each core of a processor, and opportunistically adjusts frequency and/or power supply voltage of that core without the core clocking source (e.g., PLL of that core) losing lock when the PCU 2410 and/or PMIC 2412 determines that the core is operating below a target performance level. For example, if a core is drawing current from a power supply rail less than a total current allocated for that core or processor 2404, then PCU 2410 and/or PMIC 2412 can temporality increase the power draw for that core or processor 2404 (e.g., by increasing clock frequency and/or power supply voltage level) so that the core or processor 2404 can perform at higher performance level. As such, voltage and/or frequency can be increased temporality for processor 2404 without violating product reliability.

In an example, PCU 2410 and/or PMIC 2412 may perform power management operations, e.g., based at least in part on receiving measurements from power measurement circuitries 2442, temperature measurement circuitries 2440, charge level of battery 2418, and/or any other appropriate information that may be used for power management. To that end, PMIC 2412 is communicatively coupled to one or more sensors to sense/detect various values/variations in one or more factors having an effect on power/thermal behavior of the system/platform. Examples of the one or more factors include electrical current, voltage droop, temperature, operating frequency, operating voltage, power consumption, inter-core communication activity, etc. One or more of these sensors may be provided in physical proximity (and/or thermal contact/coupling) with one or more components or logic/IP blocks of a computing system. Additionally, sensor(s) may be directly coupled to PCU 2410 and/or PMIC 2412 in at least one embodiment to allow PCU 2410 and/or PMIC 2412 to manage processor core energy at least in part based on value(s) detected by one or more of the sensors.

Also illustrated is an example software stack of device 2400 (although not all elements of the software stack are illustrated). Merely as an example, processors 2404 may execute application programs 2450, Operating System 2452, one or more Power Management (PM) specific application programs (e.g., generically referred to as PM applications 2458), and/or the like. PM applications 2458 may also be executed by the PCU 2410 and/or PMIC 2412. OS 2452 may also include one or more PM applications 2456*a*, 2456*b*, 2456*c*. The OS 2452 may also include various drivers 2454*a*, 2454*b*, 2454*c*, etc., some of which may be specific for power management purposes. In some embodiments, device 2400 may further comprise a Basic Input/Output System (BIOS) 2420. BIOS 2420 may communicate with OS 2452 (e.g., via one or more drivers 2454), communicate with processors 2404, etc.

For example, one or more of PM applications 2458, 2456, drivers 2454, BIOS 2420, etc. may be used to implement power management specific tasks, e.g., to control voltage and/or frequency of various components of device 2400, to control wake-up state, sleep state, and/or any other appropriate power state of various components of device 2400, control battery power usage, charging of the battery 2418, features related to power saving operation, etc.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

Various embodiments described herein are illustrated as examples. The features of these examples can be combined with one another in any suitable way. These examples include:

Example 1: An apparatus comprising: a first comparator coupled to a high-side switch and an inductor, and to a current digital-to-analog converter (IDAC); a sequential unit coupled to an output of the first comparator; a second comparator coupled to the high-side switch and the inductor, and to a reference voltage; and a circuitry to generate a signal to sample the output of the first comparator via the sequential unit, wherein an output of the second comparator initiates the generation of the signal.

Example 2: The apparatus of example 1 comprises a first level-shifter coupled to the output of the first comparator and an input of the sequential unit.

Example 3: The apparatus of example 2 comprises a second level-shifter coupled to the output of the second comparator and the circuitry.

Example 4: The apparatus of example 1 comprises a finite state machine to generate a multi-bit code to adjust a current strength through the IDAC.

Example 5: The apparatus of example 1 comprises a transistor to mirror the high-side switch, wherein the high-side switch and the transistor are controllable by a same signal.

Example 6: The apparatus of example 1, wherein the second comparator comprises: a resistor; an n-type transistor coupled in series with the resistor and coupled to the inductor; and a buffer having an input coupled to the n-type transistor the resistor, and an output coupled to the circuitry.

Example 7: The apparatus of example 6, wherein the n-type transistor is biased.

Example 8: The apparatus of example 1, wherein the first comparator comprises: a multi-stage amplifier; and a strong arm latch coupled to the multi-stage amplifier, wherein the strong arm latch is to generate the output.

Example 9: An apparatus comprising: a high-side switch coupled to a first supply rail and an inductor; a low-side switch coupled in series with the high-side switch; a controller to control when to turn on and off the high-side and low-side switches; and a current sensor to sample a current through the inductor after the controller turns on the high-side switch such that the current sensor is to sample substantially in a center of a ramp of the current through the inductor.

Example 10: The apparatus of example 9, wherein the current sensor comprises a comparator having an input coupled to the inductor.

Example 11: The apparatus of example 10, wherein the comparator is a first comparator, wherein the current sensor comprises a circuitry to generate a signal to sample an output of a second comparator, wherein the output of the second comparator is indicative of an on time of the high-side switch.

Example 12: The apparatus of example 11 comprises a transistor to mirror the high-side switch.

Example 13: The apparatus of example 12 comprises a current digital-to-analog converter (IDAC) coupled to the transistor, wherein the sampled output is used to control the IDAC.

Example 14: A system comprising: a memory; a processor coupled to the memory; a DC-DC converter to supply power to the processor, wherein the DC-DC converter includes: a first comparator coupled to a high-side switch and an inductor, and to a current digital-to-analog converter (IDAC); a sequential unit coupled to an output of the first comparator; a second comparator coupled to the high-side switch and the inductor, and to a reference voltage; and a circuitry to generate a signal to sample the output of the first comparator via the sequential unit, wherein an output of the second comparator initiates the generation of the signal.

Example 15: The system of example 14, wherein the DC-DC converter comprises a first level-shifter coupled to the output of the first comparator and an input of the sequential unit.

Example 16: The system of example 15 wherein the DC-DC converter comprises a second level-shifter coupled to the output of the second comparator and the circuitry.

Example 17: The system of example 15, wherein the DC-DC converter comprises a finite state machine to generate a multi-bit code to adjust a current strength through the IDAC.

Example 18: The system of example 14, wherein the DC-DC converter comprises a transistor to mirror the high-side switch, wherein the high-side switch and the transistor are controllable by a same signal.

Example 19: The system of example 14, wherein the second comparator comprises: a resistor; a n-type transistor coupled in series with the resistor and coupled to the inductor; and a buffer having an input coupled to the n-type transistor, the resistor, and an output coupled to the circuitry.

Example 20: The system of example 14, wherein the first comparator comprises: a multi-stage amplifier; and a strong arm latch coupled to the multi-stage amplifier, wherein the strong arm latch is to generate the output.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. An apparatus comprising:
   a first comparator with a first input coupled to a high-side switch and an inductor, and a second input coupled to a current digital-to-analog converter (IDAC);
   a sequential logic coupled to an output of the first comparator;
   a second comparator with a first input coupled to the high-side switch and the inductor, and a second input coupled to a reference voltage; and
   a circuitry to generate a signal to sample the output of the first comparator via the sequential logic, wherein an output of the second comparator initiates the generation of the signal.

2. The apparatus of claim 1, further comprising a first level-shifter coupled to the output of the first comparator and an input of the sequential logic.

3. The apparatus of claim 2, further comprising a second level-shifter coupled to the output of the second comparator and the circuitry.

4. The apparatus of claim 1, further comprising a finite state machine to generate a multi-bit code to adjust a current strength through the IDAC.

5. The apparatus of claim 1, wherein the signal is a first signal, and wherein the apparatus further comprises a transistor to mirror the high-side switch, wherein the high-side switch and the transistor are controllable by a second signal.

6. The apparatus of claim 1, wherein the second comparator comprises:
   a resistor;
   an n-type transistor coupled in series with the resistor and coupled to the inductor; and
   a buffer having an input coupled to the n-type transistor and the resistor, and an output coupled to the circuitry.

7. The apparatus of claim 6, wherein the n-type transistor is biased.

8. The apparatus of claim 1, wherein the first comparator comprises:
   a multi-stage amplifier; and
   a strong arm latch coupled to the multi-stage amplifier, wherein the strong arm latch is to generate the output of the first comparator.

9. An apparatus comprising:
   a high-side switch coupled to a first supply rail and an inductor;
   a low-side switch coupled in series with the high-side switch;
   a controller to control when to turn on and off the high-side and low-side switches; and
   a current sensor to sample a current through the inductor after the controller turns on the high-side switch such that the current sensor is to sample substantially in a center of a ramp of the current through the inductor, wherein the current sensor includes:
      a first comparator having an input coupled to the inductor; and
      a circuitry to generate a signal to sample an output of a second comparator, wherein the output of the second comparator is indicative of an on time of the high-side switch.

10. The apparatus of claim 9, further comprising a transistor to mirror the high-side switch.

11. The apparatus of claim 10, further comprising a current digital-to-analog converter (IDAC) coupled to the transistor, wherein the sampled output is used to control the IDAC.

12. A system comprising:
   a memory;
   a processor coupled to the memory;
   a direct current (DC)-DC converter to supply power to the processor, wherein the DC-DC converter includes:
      a first comparator with a first input coupled to a high-side switch and an inductor, and a second input coupled to a current digital-to-analog converter (IDAC);
      a sequential logic coupled to an output of the first comparator;
      a second comparator with a first input coupled to the high-side switch and the inductor, and a second input coupled to a reference voltage; and
      a circuitry to generate a signal to sample the output of the first comparator via the sequential logic, wherein an output of the second comparator initiates the generation of the signal.

13. The system of claim 12, wherein the DC-DC converter comprises a first level-shifter coupled to the output of the first comparator and an input of the sequential logic.

14. The system of claim 13, wherein the DC-DC converter comprises a second level-shifter coupled to the output of the second comparator and the circuitry.

15. The system of claim 13, wherein the DC-DC converter comprises a finite state machine to generate a multi-bit code to adjust a current strength through the IDAC.

16. The system of claim 12, wherein the signal is a first signal, and wherein the DC-DC converter comprises a transistor to mirror the high-side switch, wherein the high-side switch and the transistor are controllable by a second signal.

17. The system of claim 12, wherein the second comparator comprises:
   a resistor;
   an n-type transistor coupled in series with the resistor and coupled to the inductor; and
   a buffer having an input coupled to the n-type transistor, the resistor, and an output coupled to the circuitry.

18. The system of claim 12, wherein the first comparator comprises:
   a multi-stage amplifier; and
   a strong arm latch coupled to the multi-stage amplifier, wherein the strong arm latch is to generate the output of the first comparator.

* * * * *